(12) United States Patent
Barrett et al.

(10) Patent No.: US 7,920,387 B2
(45) Date of Patent: Apr. 5, 2011

(54) REMOVABLE CARD GUIDES FOR HORIZONTAL LINE CARDS

(75) Inventors: Chris Barrett, Nepean (CA); Shing Ho, Ottawa (CA); Rodney S. Batterton, Kanata (CA); Mark R. Harris, Woodlawn (CA)

(73) Assignee: Ciena Corporation, Linthicum, MD (US)

(*) Notice: Subject to any disclaimer, the term of this patent is extended or adjusted under 35 U.S.C. 154(b) by 341 days.

(21) Appl. No.: 12/197,387

(22) Filed: Aug. 25, 2008

(65) Prior Publication Data

US 2010/0046181 A1 Feb. 25, 2010

(51) Int. Cl.
*H05K 5/00* (2006.01)
(52) U.S. Cl. .................. 361/756; 361/741; 361/802
(58) Field of Classification Search .................. 361/756, 361/727, 741, 686, 802; 439/374, 377
See application file for complete search history.

(56) References Cited

U.S. PATENT DOCUMENTS

| 6,166,917 | A  | * | 12/2000 | Anderson ...................... 361/756 |
| 6,198,633 | B1 | * | 3/2001  | Lehman et al. ................ 361/756 |
| 6,646,890 | B1 | * | 11/2003 | Byers et al. .................... 361/802 |
| 7,224,588 | B2 |   | 5/2007  | Nieman et al. |
| 7,277,296 | B2 | * | 10/2007 | Ice ................ 361/756 |
| 7,649,751 | B2 | * | 1/2010  | Nguyen et al. ................ 361/802 |
| 2008/0037214 | A1 | * | 2/2008 | Niazi et al. .................... 361/687 |

* cited by examiner

*Primary Examiner* — Hung S Bui
(74) *Attorney, Agent, or Firm* — Clements Bernard PLLC; Christopher L. Bernard; Tyler S. Brown

(57) ABSTRACT

A chassis for telecommunication gear including horizontal circuit boards includes an enclosure forming a front-accessible circuit board slot for receiving horizontal circuit boards. The circuit board slot has first connectors for receiving mating second connectors on the circuit boards, and multiple circuit board guides for guiding and securing horizontal circuit boards inserted into the slot. Adjacent pairs of the guides are spaced to receive circuit boards of predetermined widths, and at least one of the guides is removable so that it can be re-positioned within the slot for changing the spacing between adjacent pairs of the guides to receive circuit boards of different widths. The circuit boards may be telecommunication line cards.

14 Claims, 4 Drawing Sheets

REMOVABLE CARD GUIDES FOR HORIZONTAL LINE CARDS

FIELD OF THE INVENTION

The present invention generally relates to rack-mountable chassis for telecommunication equipment and, in particular, to removable card guides for use in guiding and securing horizontal line cards in such chasses.

BACKGROUND OF THE INVENTION

This invention relates to removable card guides for horizontal circuit boards as commonly found in "pizza-box" shaped chasses for telecommunication gear. The invention applies generally to systems of 1U to 4U in height (where "U" represents 1.75 inches). Existing systems can have different types of cards that can be replaced to offer different interfaces. However, usually it is necessary to remove the upper lid of the chassis in order to remove the cards, and it is typically impossible to change the width of a line card without removing the top lid to change the configuration of the card guides. This upgrade cannot be done in the field as it requires that the chassis be returned to the vendor, because removing the lid voids the warranty. Therefore, changing the line card width is highly service-affecting and requires significant planning. It is also important to allow for different size line cards to be inserted in the system as different combinations of interfaces require different card sizes. Furthermore, the use of different sizes of line cards reduces the amount of inventory required to build a system and minimizes the number of parts that are required to manufacture a system so the volumes can be maximized.

SUMMARY OF THE INVENTION

In one embodiment, a chassis for telecommunication gear including horizontal circuit boards includes an enclosure forming a front-accessible circuit board slot for receiving horizontal circuit boards. The circuit board slot has first connectors for receiving mating second connectors on the circuit boards, and multiple circuit board guides for guiding and securing horizontal circuit boards inserted into the slot. Adjacent pairs of the guides are spaced to receive circuit boards of predetermined widths, and at least one of the guides is removable so that it can be re-positioned within the slot for changing the spacing between adjacent pairs of the guides to receive circuit boards of different widths. The circuit boards may be telecommunication line cards.

In one implementation, the circuit board slot has a pair of fixed circuit board guides on opposite sides of the slot, and at least one removable circuit board guide between the fixed circuit board guides. The removable card guide may be detachably fastened to the bottom wall of the chassis with removable fasteners accessible through the front of the chassis.

A pair of circuit board guides that are mirror images of each other may be attached back-to-back so that one of the pair forms a right-side guide and the other of the pair forms a left-side guide.

One embodiment of a method of installing horizontal circuit boards in a chassis having a front-accessible circuit board slot comprises inserting multiple horizontal circuit boards into a circuit board slot in an enclosure having first connectors for receiving mating second connectors on the circuit boards, and guiding and securing the circuit boards within the slot with adjacent pairs of circuit board guides that are spaced to receive circuit boards of predetermined widths, at least one of the guides being removable so that it can be re-positioned within the slot, from the front of the chassis, for changing the spacing between adjacent pairs of the guides to receive circuit boards of different widths.

BRIEF DESCRIPTION OF THE DRAWINGS

The invention will be better understood from the following description of preferred embodiments together with reference to the accompanying drawings, in which.

DETAILED DESCRIPTION

Although the invention will be described in connection with certain preferred embodiments, it will be understood that the invention is not limited to those particular embodiments. On the contrary, the invention is intended to cover all alternatives, modifications, and equivalent arrangements as may be included within the spirit and scope of the invention as defined by the appended claims.

Figure 1:
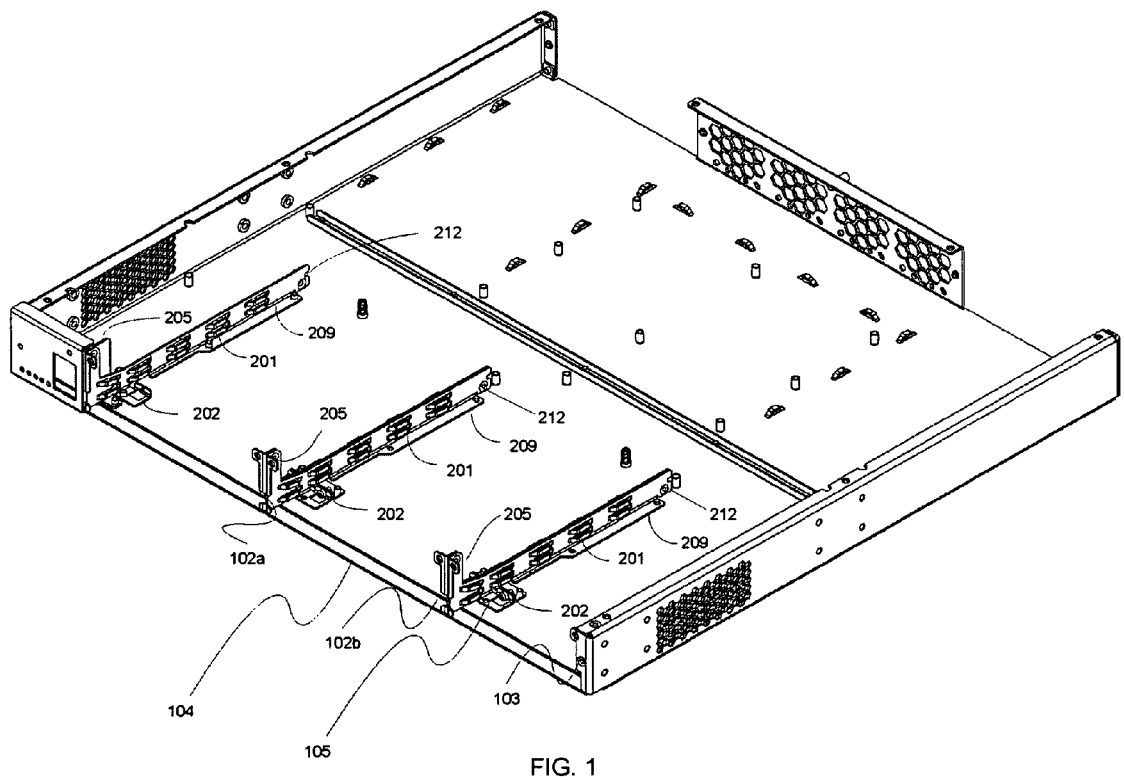
FIG. 1 is a top perspective of a rack-mounted chassis with the lid removed to reveal the internal card guides.

Turning now to drawings and referring first to FIG. 1, a chassis 100 includes an enclosure 104 that forms a front-accessible circuit board slot 104a designed to house one or many horizontal line cards for telecommunication gear. The enclosure 104 typically has a width of either about 19 or about 23 inches for mounting in standard-sized racks, and a height between about 1U and about 4U, i.e., from about 1.75 to about 7 inches. The rear wall of the card slot 104a is equipped with connectors for receiving mating connectors on the line cards, to couple the line cards to a back plane.

The line cards are secured in the chassis by fixed side card guides 101, 103 and removable middle card guides 102a, 102b. In this example, the chassis can hold up to three cards, but if one of the middle card guides 102a or 102b is removed, then the chassis can hold one smaller card and one larger card (of up to double the width). If both middle card guides 102a and 102b are removed, then the system can hold one large line card. Alternatively, one or both middle card guides can be re-positioned within the card slot to accommodate cards of different widths. Systems can be designed with any number of middle card guides to divide the space according to the line card portfolio supported by the system. The card guides 101, 102a, 102b and 103 are secured to the base 104a of the chassis 104 using mounting elements 105. The left-most and right-most card guides can optionally be permanently attached to the chassis.

Figure 2:
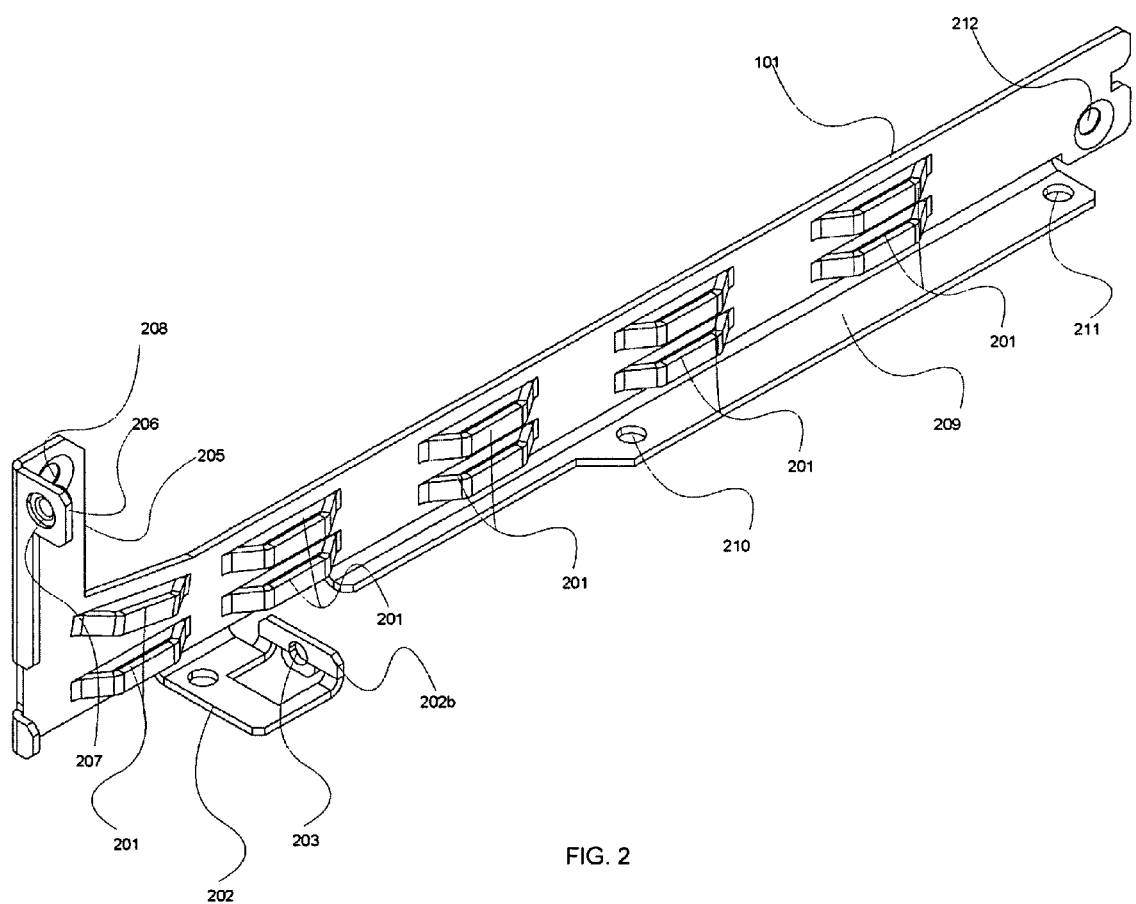
FIG. 2 is an enlarged perspective view of one of the left side card guides in the chassis shown in FIG. 1.

As can be seen most clearly in FIG. 2, the left side card guide 101 includes bridge lances 201 on its right side, to guide the line card and secure it in position. The guide 101 also includes a base 202 which has a vertical tab 202a forming a hole 203 to attach the guide 101 to the mounting element 105. The left card guide 101 also includes a front vertical extension 205 that has a tab 206 forming a hole 207 for securing the line card onto the guide 101 when the line card is installed. Rivet holes 208 and 212 in the guide 101 are used for optionally securing, using rivets, a left card guide to a right card guide to create a middle card guide, as described in more detail below.

Figure 3:
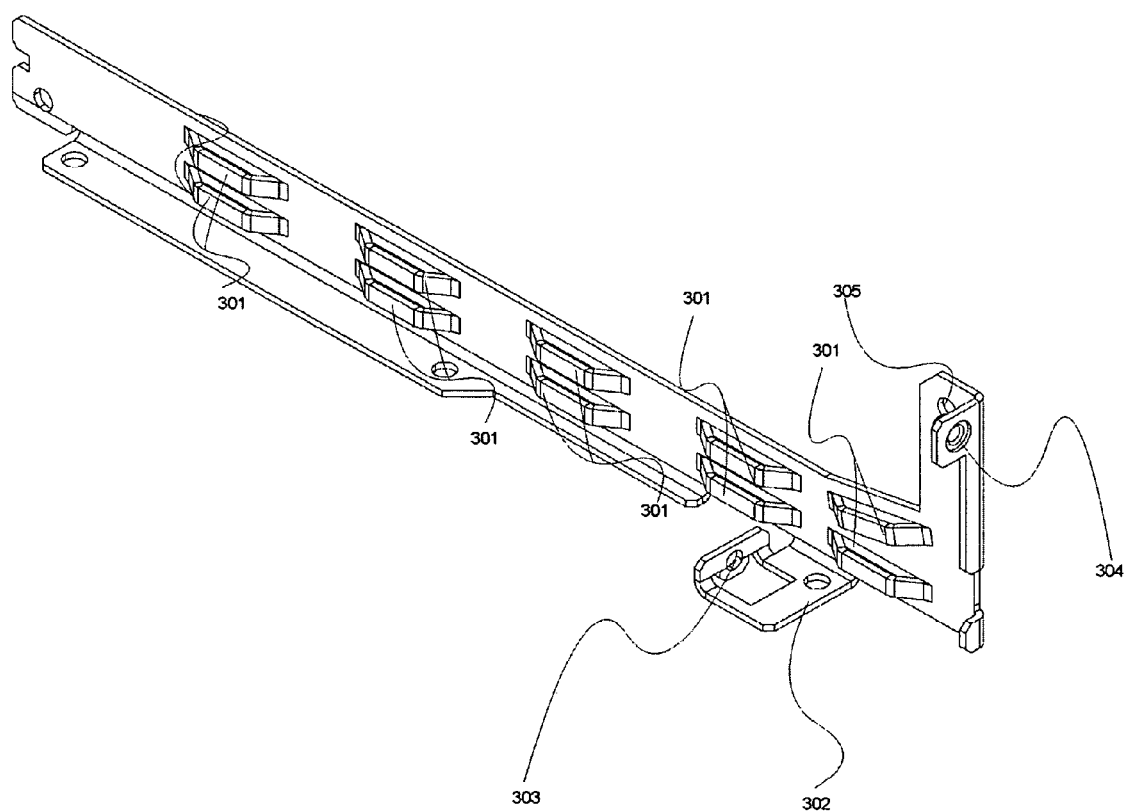
FIG. 3 is an enlarged perspective view of one of the right side card guides in the chassis shown in FIG. 1.

As shown in FIG. 3, the right side card guide 103 is designed in a mirrored manner to the left side card guide 101. The right card guide 103 includes bridge lances 301 on its left side to guide the line card and secure it in position, and a base 302 which has a vertical tab 302a forming a hole 303 to attach the guide 103 to the mounting element 105. The right card guide 103 also includes a front vertical extension 305 that has a tab 306 forming a hole 307 for securing the line card onto the guide 103 when the line card is installed. Rivet holes 308 and 312 in the guide 103 are used for optionally securing, using rivets, a left card guide to a right card guide to create a middle card guide, as described in detail below.

Middle card guides include both a left card guide and a right card guide. The middle card guide can be manufactured as an integral separate piece, or it can be created by riveting together a left and right card guides that are mirror images of each other so that they can be attached to each other back to back. Using the left and right card guides to create the middle card guide allows a reduction in the number of different parts in inventory and increases the manufacturing volume for the left and right card guides, thus reducing cost.

Figure 4:
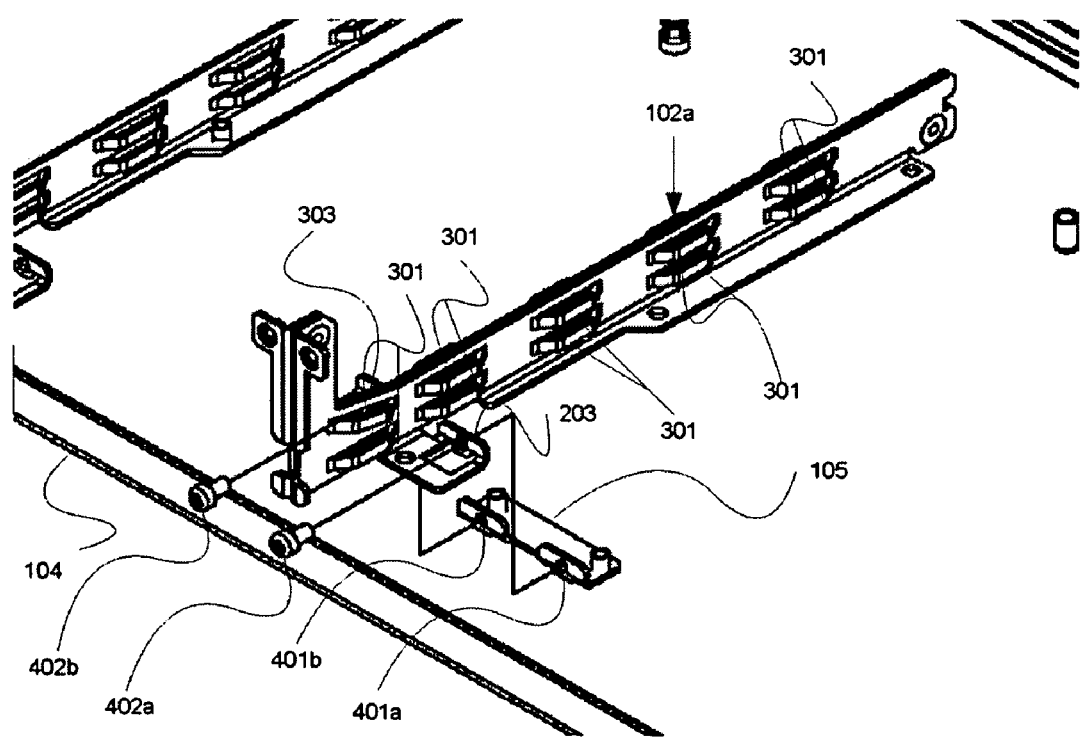
FIG. 4 is an enlarged, exploded perspective view of one of the front mounting assemblies for the card guides in the chassis shown in FIG. 1.

Referring to FIG. 4, the middle card guide 102a is secured by a mounting element 105 that is attached to the base 104a of the chassis 104. The mounting element 105 includes a pair of vertical tabs 105a and 105b having respective front-facing threaded holes 401a and 401b. The right side of the middle card guide 102a is detachably fastened to the mounting element 105 by inserting a screw 402a into the front-facing hole 203 and then into a threaded hole 401a in the mounting element. The left side of the card guide is attached the same way using a screw 402b, through the front-facing hole 303 to terminate into a threaded hole 401b in the mounting element.

By exposing the screws 402a, 402b at the front of the system, the middle card guide 102a can be removed by simply unscrewing the screws 402a, 402b without having to remove the top lid. Similarly, additional middle card guides can be installed by screwing the screws of the card guide from the front panel of the system, without removing the top lid. Line cards are secured to the card guides using the front-facing holes 207 and 307. Upgrades of line cards of different types or sizes can then be implemented in the field, even while the unit is powered, thus not affecting services running on other line cards of the system.

Middle card guides can also be slidably secured at the back for added support, either using inserts in the backplane of the system or by putting rails at the bottom of the chassis 104. Mounting elements can also be secured to the top wall of the chassis instead of the bottom wall.

In another embodiment of this invention, the mounting element 105 (FIG. 1) is implemented using one or more slots or openings at the bottom wall of the chassis. The base 302 (FIG. 3) is implemented using matching hooks that can slidably or rotatably lock inside the the one or more slots or openings without need for screws.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A chassis for telecommunication gear including horizontal circuit boards, said chassis comprising
   an enclosure forming a front-accessible circuit board slot for receiving horizontal circuit boards, and
   multiple circuit board guides in said circuit board slot for guiding and securing horizontal circuit boards inserted into said slot, adjacent pairs of said guides being spaced to receive circuit boards of predetermined widths, at least one of said guides being removable so that it can be re-positioned within said slot for changing the spacing between adjacent pairs of said guides to receive circuit boards of different widths,
   wherein the multiple circuit board guides comprise a pair of circuit board guides that are mirror images of each other and are attached back-to-back so that one of said pair forms a right-side guide and the other of said pair forms a left-side guide.

2. The chassis of claim 1 in which said enclosure has a height between about 1.5 and about 6 inches.

3. The chassis of claim 1 in which said enclosure has a width between about 17 and about 23 inches.

4. The chassis of claim 1 in which said circuit boards are telecommunication line cards.

5. The chassis of claim 1 in which said circuit board slot has a pair of fixed circuit board guides on opposite sides of said slot, and at least one removable circuit board guide between said fixed circuit board guides.

6. The chassis of claim 1 in which said removable card guide is detachably fastened to the bottom wall of said chassis with removable fasteners accessible through the front of said chassis.

7. The chassis of claim 1 in which said removable card guide is detachably fastened to the top wall of said chassis with removable fasteners accessible through the front of said chassis.

8. The chassis of claim 1 in which said removable card guide in which the bottom wall of said chassis forms at least one slot or opening, and said removable guide includes at least one hook located at the bottom of said removable guide for detachably securing said removable guide to said bottom wall by rotatably or slidably secured said hook into said slot or opening.

9. A method of installing horizontal circuit boards in a chassis having a front-accessible circuit board slot, said method comprising
   inserting multiple horizontal circuit boards into a circuit board slot in an enclosure, and
   guiding and securing said circuit boards within said slot with adjacent pairs of circuit board guides that are spaced to receive circuit boards of predetermined widths, at least one of said guides being removable so that it can be re-positioned within said slot, from the front of said chassis, for changing the spacing between adjacent pairs of said guides to receive circuit boards of different widths,
   wherein the adjacent pairs of circuit board guides comprise a pair of circuit board guides that are mirror images of each other and are attached back-to-back so that one of said pair forms a right-side guide and the other of said pair forms a left-side guide.

10. The method of claim 9 in which said enclosure has a height between about 1.5 and 6 inches.

11. The method of claim 9 in which said enclosure has a width of about 17 inches.

12. The method of claim 9 in which said circuit boards are telecommunication line cards.

13. The method of claim 9 in which said circuit board slot has a pair of fixed circuit board guides on opposite sides of said slot, and at least one removable circuit board guide between said fixed circuit board guides.

14. The method of claim 9 in which said removable card guide is detachably fastened to the bottom wall of said circuit board slot with removable fasteners accessible through the front of said slot.

* * * * *